United States Patent
Wang

(10) Patent No.: US 8,399,269 B2
(45) Date of Patent: Mar. 19, 2013

(54) LED FLIP-CHIP PACKAGE STRUCTURE WITH DUMMY BUMPS

(75) Inventor: Chung-Yu Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/474,282

(22) Filed: May 17, 2012

(65) Prior Publication Data
US 2012/0225509 A1    Sep. 6, 2012

Related U.S. Application Data

(62) Division of application No. 12/715,838, filed on Mar. 2, 2010, now Pat. No. 8,183,579.

(51) Int. Cl.
*H01L 21/00*    (2006.01)

(52) U.S. Cl. ............... 438/22; 438/48; 257/E21.617; 257/E21.053

(58) Field of Classification Search ................. 438/22, 438/27, 48, 65, 66, 69; 257/E21.527, E21.617, 257/E21.053
See application file for complete search history.

(56) References Cited

U.S. PATENT DOCUMENTS

| | | | |
|---|---|---|---|
| 7,842,542 B2 | 11/2010 | Shim et al. | |
| 2004/0188696 A1* | 9/2004 | Hsing Chen et al. | 257/99 |
| 2006/0278885 A1 | 12/2006 | Tain et al. | |
| 2010/0140772 A1* | 6/2010 | Lin et al. | 257/686 |

* cited by examiner

*Primary Examiner* — Hoai V Pham
(74) *Attorney, Agent, or Firm* — Haynes and Boone, LLP

(57) ABSTRACT

A light-emitting device (LED) package component includes an LED chip having a first active bond pad and a second active bond pad. A carrier chip is bonded onto the LED chip through flip-chip bonding. The carrier chip includes a first active through-substrate via (TSV) and a second active TSV connected to the first and the second active bond pads, respectively. The carrier chip further includes a dummy TSV therein, which is electrically coupled to the first active bond pad, and is configured not to conduct any current when a current flows through the LED chip.

21 Claims, 5 Drawing Sheets

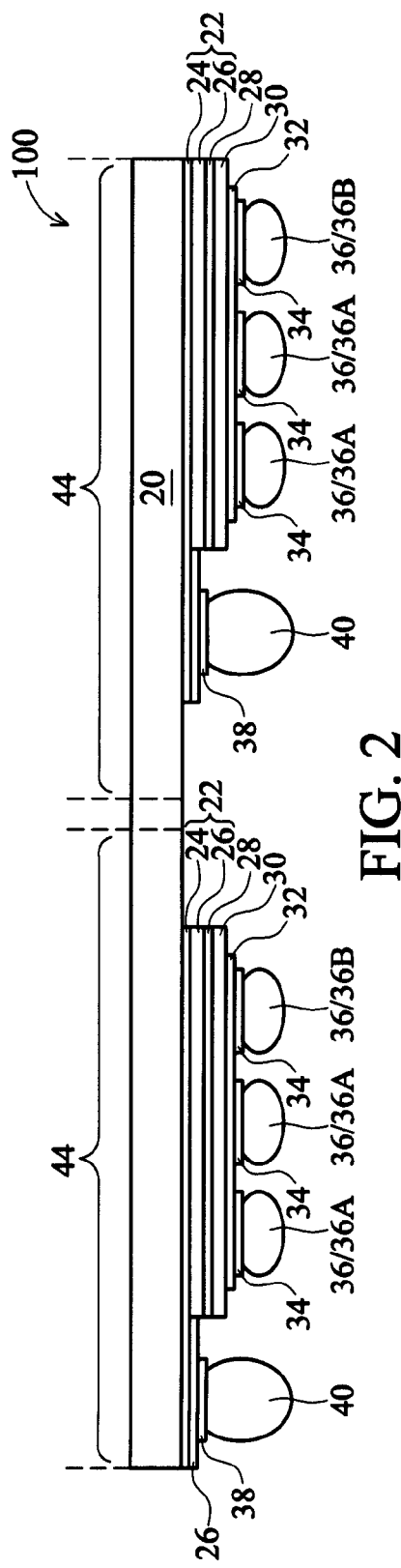
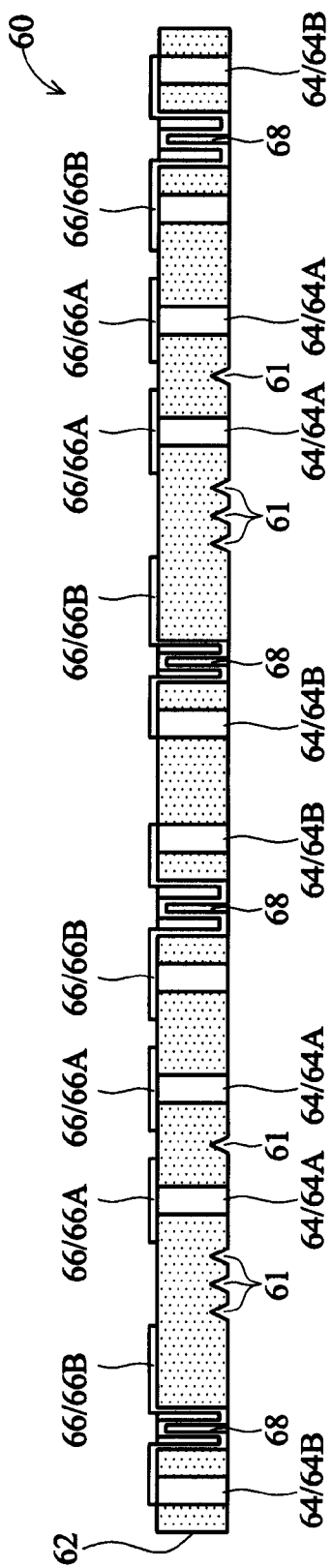

LED FLIP-CHIP PACKAGE STRUCTURE WITH DUMMY BUMPS

PRIORITY DATA

This application is a Divisional application of Ser. No. 12/715,838 filed on Mar. 2, 2010, now U.S. Pat. No. 8,183,579 issued May 22, 2012, entitled "LED Flip-Chip Package Structure with Dummy Bumps," the entire disclosure of which is incorporated herein by reference.

TECHNICAL FIELD

This disclosure relates generally to light-emitting device (LED) package components, and more particularly to LED package structures including through-substrate vias (TSVs).

BACKGROUND

In recent years, optical devices, such as light-emitting diodes (LED), laser diodes, and UV photo-detectors have increasingly been used. Group-III nitride compounds, such as gallium nitride (GaN) and their related alloys, have been known suitable for the formation of the optical devices. The large bandgap and high electron saturation velocity of the group-III nitride compounds also make them excellent candidates for applications in high-temperatures and high-speed power electronics.

Due to the high equilibrium pressure of nitrogen at typical growth temperatures, it is extremely difficult to obtain GaN bulk crystals. Therefore, GaN layers and the respective LEDs are often formed on other substrates that match the characteristics of GaN. Sapphire ($Al_2O_3$) is a commonly used substrate material. FIG. 1 illustrates a cross-sectional view of an LED package component. LED 2, which includes a plurality of GaN-based layers formed on sapphire substrate 4. Sapphire substrate 4 is further mounted on lead frame 6. Electrodes 8 and 10 electrically connect LED 2 to lead frame 6 through gold wires 12.

It was observed that sapphire has a low thermal conductivity. Accordingly, the heat generated by LED 2 cannot be dissipated efficiently through sapphire substrate 4. Instead, the heat needs to be dissipated through the top end of LED 2 and through gold wires 12. However, since gold wires 12 are relatively long since they have to extend to lead frame 6, the heat-dissipating efficiency through gold wires 12 is also low. In addition, electrode 10 occupies chip area, and hence the LED light output area is not optimized.

SUMMARY

In accordance with one aspect, a light-emitting device (LED) package component includes an LED chip having a first active bond pad and a second active bond pad. A carrier chip is bonded to the LED chip through flip-chip bonding. The carrier chip includes a first active through-substrate via (TSV) and a second active TSV connected to the first and the second active bond pads, respectively. The carrier chip further includes a dummy TSV therein, which is electrically coupled to the first active bond pad and is configured not to conduct any current when a current flows through the LED chip.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 through 6 are cross-sectional views of intermediate stages in the manufacturing of a package component including an LED in accordance with an embodiment.

DETAILED DESCRIPTION OF ILLUSTRATIVE EMBODIMENTS

Figure 1:
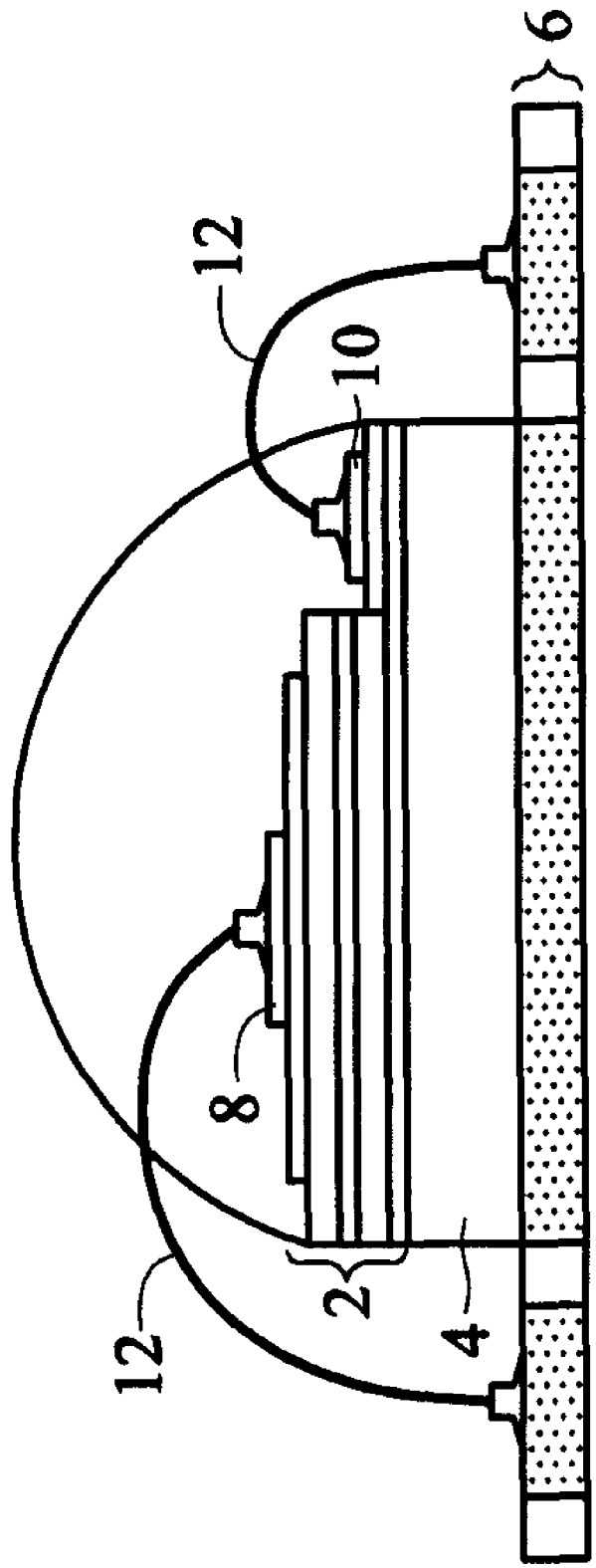
FIG. 1 illustrates a cross-sectional view of a conventional light-emitting device (LED) package structure formed on a sapphire substrate.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) package component and the method of forming the same are presented. The intermediate stages of manufacturing an embodiment are illustrated. The variations of the embodiment are then discussed. Throughout the various views and illustrative embodiments, like reference numbers are used to designate like elements.

FIG. 2 illustrates wafer 100, which includes LEDs 22 formed on substrate 20. In an embodiment, substrate 20 is formed of sapphire ($Al_2O_3$, which is transparent), although it may also be formed of other materials having characteristics close to the characteristics of the layers in LEDs 22 (which may comprise group-III and group-V elements, or also known as III-V compound semiconductor materials). Substrate 20 may also be a silicon carbide substrate, a silicon substrate with a silicon carbide layer thereon, a silicon germanium substrate, or other applicable semiconductor substrates.

In an exemplary embodiment, un-doped gallium nitride (u-GaN) layer 24 is formed on, and possibly contacts, substrate 20. In an embodiment, u-GaN layer 24 is substantially free from elements other than Ga and N. LEDs 22 are formed on, and may possibly contact, u-GaN layer 24. LEDs 22 may include a plurality of layers. In an exemplary embodiment, each of LEDs 22 include n-GaN layer (GaN doped with an n-type impurity) 26, multiple quantum well (MQW) 28, p-GaN layer (GaN doped with a p-type impurity) 30, reflector 32, and top electrodes (which are also bond pads) 34. Reflectors 32 may be formed of metal, for example. MQWs 28 may be formed of, for example, InGaN, and act as active layers for emitting light. The formation of layers 26, 28, 30, 32, and 34 are known in the art, and hence are not repeated herein. In an exemplary embodiment, the formation methods of layers 26, 28, and 30 include epitaxial growth. It is realized that LEDs 22 may have many designs and FIG. 2 only shows an exemplary version among the available variations. For example, the materials of each of layers 26, 28, and 30 may be different from the above-discussed materials, and may include ternary III-V compound semiconductor materials, such as GaAsP, GaPN, AlInGaAs, GaAsPN, and AlGaAs, or the like. Also, the positions of n-GaN layer 26 and p-GaN layer 30 may be swapped.

Each of LEDs 22 further comprise bond pads 38, which are used to connect to n-GaN layer 26. Accordingly, bond pads 34 and 38 are used to apply a voltage to the respective LED 22, so that the respective LED 22 is activated to emit light. In an embodiment, at least one of electrodes 34 in each of LEDs 22 has a current flowing through during the usage (light emission) of LED 22, while one or more electrodes 34 are dummy electrodes, which do not have any current flowing through when the voltage is applied.

Solder bumps 36 (including active solder bumps 36B and dummy solder bumps 36A) and 40 are formed on LEDs 22. Solder bumps 36 and 40 may be formed of commonly used solder materials, such as lead-free solders, eutectic solders, or the like. After the formation of solder bumps 36 and 40, wafer 100 is diced into a plurality of LED chips 44, with each of the LED chips 44 comprising one or more LED 22. In the embodiment wherein each LED chip 44 includes more than one LED chip 44 on a same substrate 20, the LEDs 22 in the same LED chips are referred to as LED tiles. After LED chips 44 are sawed from wafer 100, bevel cuts 42 (not shown in FIG. 2, please refer to FIG. 4) may be formed at the edges of LED chips 44, so that the respective edge forms a slant angle (not equal to 90 degrees) with the surface plane of the respective substrate 20. Bevel cuts 42 may reduce the stress in the resulting package structure.

Referring to FIG. 3, carrier wafer 60 is provided. Carrier wafer 60 comprises substrate 62, which may be a semiconductor substrate, such as a silicon substrate, or may be a dielectric substrate. Through-substrate vias (TSVs) 64 (including dummy TSVs 64A and active TSVs 64B) are formed in substrate 62, and may electrically connect features on opposite sides of substrate 62. TSVs 64 may be formed of copper or other metals, such as tungsten, or alloys thereof. Bond pads 66 are formed on one side of carrier wafer 60 and connect to TSVs 64.

TSVs 64 include TSVs 64B (referred to as active TSVs) that are used for conducting a current for driving LED chip 44 and optional dummy TSVs 64A. Throughout the description, dummy TSVs 64A are also referred to as thermal TSVs since they have the function of dissipating heat. Similarly, the bond pads 66 that have a current flowing through during the light-emission of the respective LED chips 44 (after the LED chips 44 are bonded) are referred to as active bond pads 66B, while the bond pads 66 that do not have any current flowing through during the light-emission of the respective LED chips 44 are referred to as dummy bond pads 66A. Optionally, ohmic lines 68 are embedded inside carrier wafer 60. Ohmic lines 68 may interconnect bond pads, so that they may be used to regulate the current flowing through LED chips 44 that are to be bonded onto carrier wafer 60. Alternatively, no ohmic lines are formed. Instead, metal features having negligible resistances are used.

Carrier wafer 60 may include bevel cuts 61, which are groves extending from a major surface of carrier wafer 60 into carrier wafer 60. Bevel cuts 61 may have a v-shape cross-sectional view, a rectangular cross-sectional view, or the like. The formation of bevel cuts 61 results in the increase in the surface area of carrier wafer 60, which in turn results in the improvement in the heat dissipating ability of carrier wafer 60. However, the formation of bevel cuts 61 may result in the mechanical strength of carrier wafer 60 to be sacrificed, and the depths of bevel cuts 61 need to be tuned to satisfy both the heat-dissipation requirement and the specification of the mechanical strength.

Figure 4:
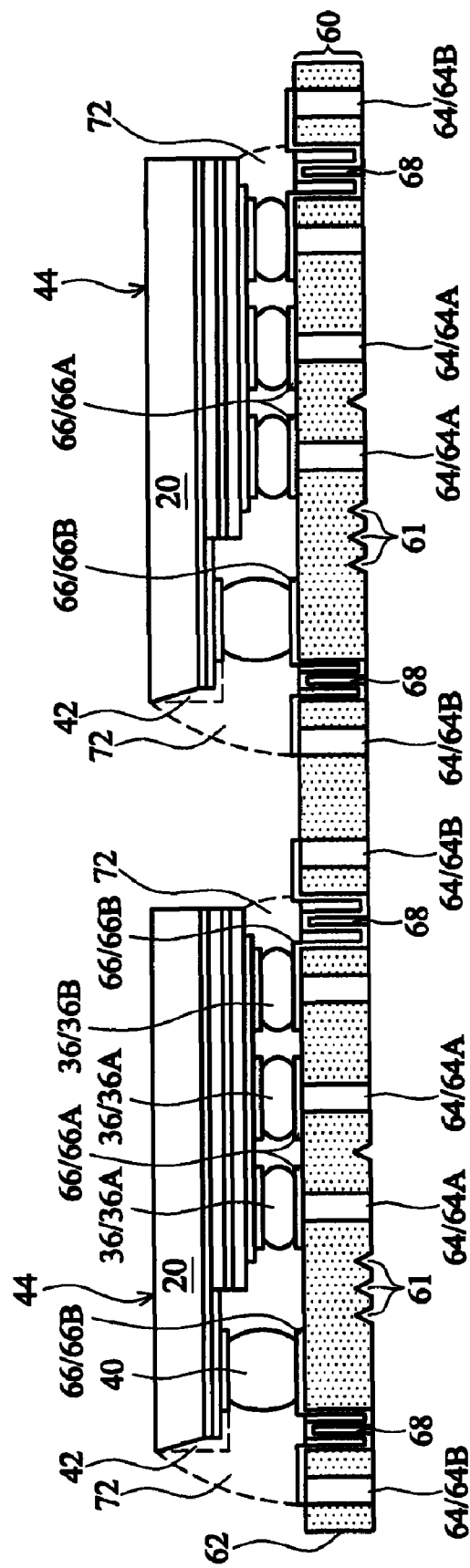

Referring to FIG. 4, a plurality of LED chips 44 diced from wafer 100 is bonded onto carrier wafer 60 through flip-chip bonding. During the bonding process, solder bumps 36 and 40 are reflowed to join bond pads 34 and 38. Optionally, underfill 72 may be filled into the gaps between LED chips 44 and carrier wafer 60. During the dispensing of underfill 72, bevel cuts 42 may reduce the difficulty of dispensing.

Figure 5:
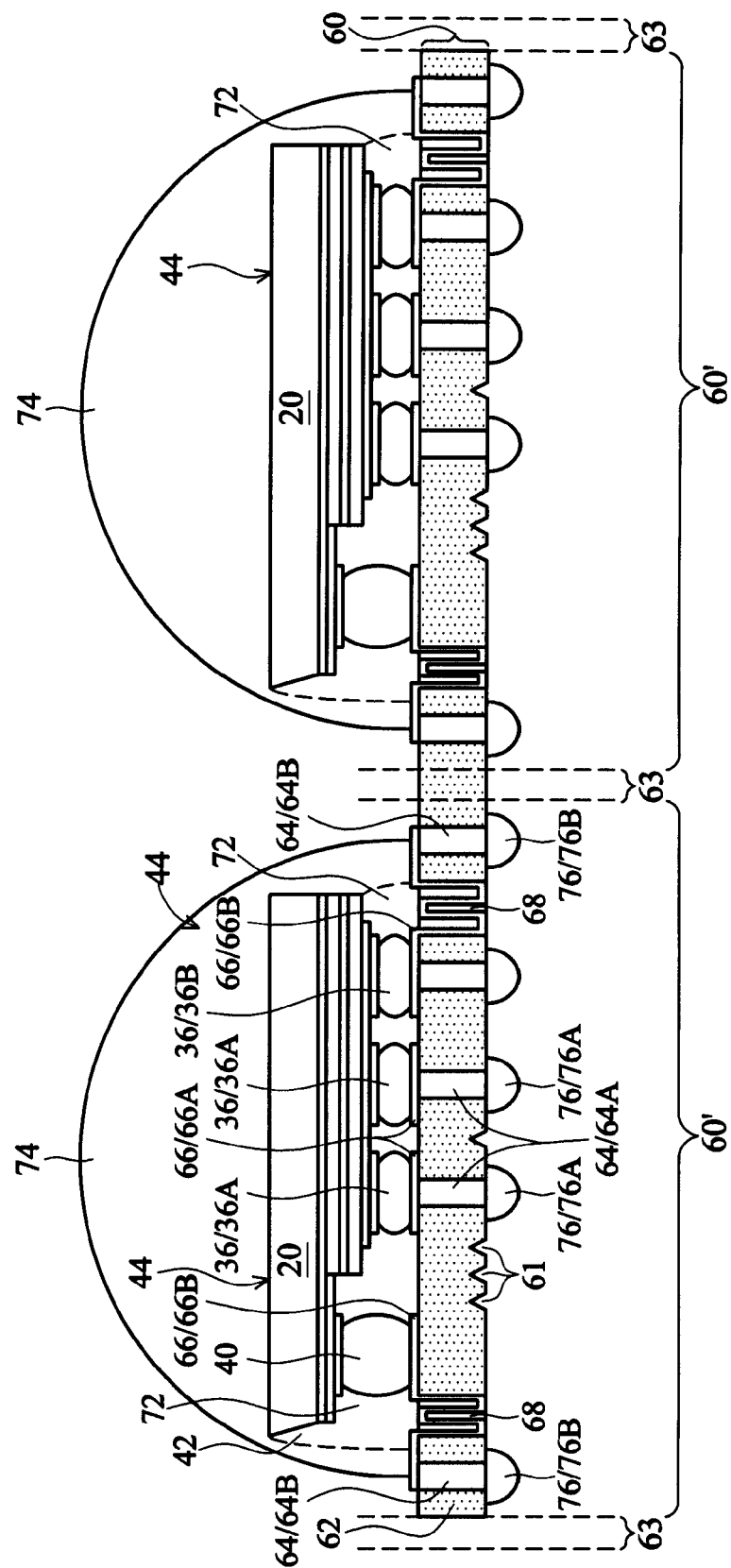

Referring to FIG. 5, silicone lenses 74 are molded onto LED chips 44. The molding of silicone lenses 74 is known in the art and hence is not repeated herein. Each of silicone lenses 74 may cover the respective LED chips 44. In the case no underfill 72 is filled, silicone will also be filled into the gaps between LED chips 44 and carrier wafer 60 and performs the function of underfill 72.

Solder balls 76 are then formed onto carrier wafer 60, and are connected to TSVs 64. In an embodiment, all of TSVs 64, including thermal TSVs 64A and active TSVs 64B, have solder balls 76 (including active solder balls 76B and dummy solder balls 76A) formed thereon. In alternative embodiments, only active TSVs 64B have solder balls 76 formed thereon, while no solder balls 76 are formed on thermal TSVs 64A.

In an embodiment, after solder balls 76 are mounted onto carrier wafer 60, carrier wafer 60 is sawed along scribe lines 63, so that the structure shown in FIG. 5 is separated into individual package components. Accordingly, carrier wafer 60 is separated into a plurality of carrier chips 60', with each carrier chips 60' being bonded to at least one LED chip 44. In alternative embodiments, carrier wafer 60 is sawed apart first, and then solder balls 76 are mounted onto the resulting packages. In the LED package components, solder balls 76B are active solder balls, through which a voltage may be applied to LED chip 44, and a current flows through active solder balls 76B when the voltage is applied. On the other hand, solder balls 76A are dummy solder balls and may not have any current flowing when the voltage is applied.

Figure 6:
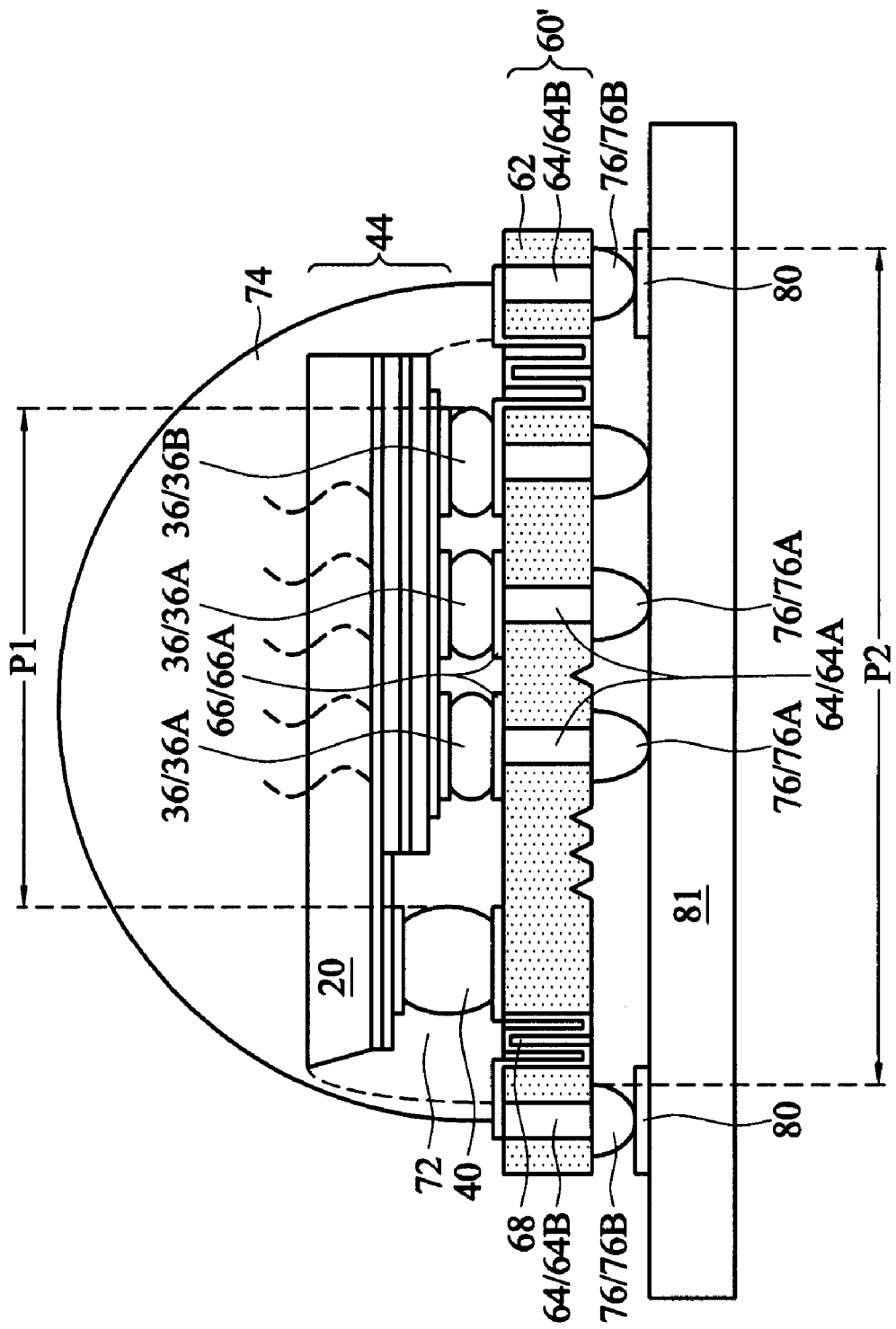

FIG. 6 schematically illustrates electrical component 81 bonded to solder balls 76B through, for example, bond pads 80. No bond pads are bonded onto thermal dummy solder balls 76A. Electrical component 81 may be a printed circuit board (PCB) or other types of electrical packaging devices. Since no current flows through dummy solder balls 76A, no current flows through thermal TSVs 64A and dummy solder bumps 36A either. However, thermal TSVs 64A and dummy solder bumps 36A are formed of metals, and hence have an excellent thermal conductivity. The heat generated in LED chips 44 may be conducted to carrier chips 60' easily through thermal TSVs 64A and dummy solder bumps 36A. Accordingly, the heat dissipating ability of the LED package component, as shown in FIG. 6, is improved over conventional LED packages where the light may be partially blocked by elements of the package. Further, the light generated by LED chips 44 is emitted through substrate 20 that is transparent, and is not blocked by any wire or bond pad. Accordingly, the light output efficiency in accordance with various embodiments of the present invention is high and improved over conventional LED packages where the thermal path included materials having low thermal conductivity. Further, since pitch P2 between active solder balls 76B (and between active TSVs 64B) is greater than the pitch P1 between active solder bumps 36B and 40 (which is also the pitch between the respective bond pads 34 and 38, the resulting package is a fan-out package that may be easily bonded, for example, onto other electrical components, such as printed circuit boards (PCBs).

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method, comprising:
receiving a first substrate having a light-emitting diode (LED) formed thereon;
receiving a second substrate having a plurality of conductive elements extending through the second substrate, wherein the second substrate includes a non-flat surface; and
bonding the first substrate to the second substrate in a manner such that the LED is thermal-conductively bonded to the plurality of conductive elements of the second substrate.

2. The method of claim 1, wherein the first substrate contains at least one of:
sapphire, silicon carbide, silicon germanium, and silicon.

3. The method of claim 1, wherein:
the LED contains a p-type semiconductor layer, an n-type semiconductor layer, and a multiple quantum well disposed between the p-type semiconductor layer and the n-type semiconductor layer; and
the bonding is performed in a manner such that at least one of the conductive elements is electrically coupled to the n-type semiconductor layer, and at least another one of the conductive elements is electrically coupled to the p-type semiconductor layer.

4. The method of claim 1, wherein at least a subset of the conductive elements are dummy elements configured to be free of electrical current flow.

5. The method of claim 1, wherein the conductive elements include through-silicon-vias (TSVs).

6. The method of claim 1, wherein:
the receiving the first substrate includes receiving the first substrate having a plurality of first metal pad thermal-conductively coupled to the LED;
the receiving the second substrate includes receiving the second substrate having a plurality of second metal pads each thermal-conductively coupled to a respective one of the conductive elements of the second substrate; and
the bonding is performed in a manner such that each of the first metal pads is bonded to a respective one of the second metal pads.

7. The method of claim 1, wherein the bonding includes a flip-chip bonding process.

8. The method of claim 1, further comprising: forming a lens over the second substrate, the second lens housing the LED therein.

9. The method of claim 1, further comprising: bonding the second substrate to an electrical packaging device.

10. A method of packaging a light-emitting diode (LED), comprising:
providing an LED chip having a plurality of conductive pads formed thereon, wherein at least a subset of the conductive pads are electrical dummy pads;
providing a carrier substrate having a plurality of through-silicon-vias (TSV) extending from a front surface to a back surface of the carrier substrate;
bonding the LED chip to the carrier substrate such that each of the conductive pads is thermal-conductively coupled to a respective one of the TSVs; and
molding a lens over the carrier substrate and over the LED chip.

11. The method of claim 10, wherein the providing the LED chip is performed such that the LED chip is formed on a substrate containing one of: a sapphire material, a silicon carbide material, and a silicon germanium material.

12. The method of the claim 10, wherein the providing the carrier substrate is performed such that the carrier substrate includes a bevel surface.

13. The method of claim 10, wherein the bonding is performed using a flip-chip bonding process.

14. A method of claim 10, further comprising: bonding the carrier substrate to a printed circuit board such that the LED chip and the printed circuit board are located on opposite sides of the carrier substrate.

15. A method of forming a light-emitting device (LED) package component, the method comprising:
providing an LED wafer comprising an LED chip, wherein the LED chip comprises a first active bond pad and a second active bond pad;
sawing the LED chip from the LED wafer; and
bonding the first active bond pad and the second active bond pad of the LED chip onto a carrier chip through flip-chip bonding through soldering a first solder bump and a second solder bump, wherein the carrier chip comprises:
a first active through-substrate via (TSV) and a second active TSV configured to electrically connect features on opposite sides of the carrier chip and a dummy TSV;
wherein the first active TSV and the second active TSV are electrically connected to the first solder bump and the second solder bump, respectively; and
wherein the dummy TSV is connected to the LED chip through a dummy solder bump.

16. The method of claim 15 further comprising forming a first solder ball and a second solder ball on the carrier chip and electrically connected to the first active TSV and the second active TSV, respectively, with the first solder ball and a second solder ball being on an opposite side of the carrier chip than the first and the second solder bumps, wherein no solder ball is formed on the dummy TSV.

17. The method of claim 16, wherein the carrier chip comprises bevel cuts on a same side of the carrier chip as the first solder ball and the second solder ball.

18. The method of claim 15 further comprising, after the step of sawing the LED chip from the LED wafer, forming a bevel cut on an edge of the LED chip.

19. The method of claim 15, wherein the carrier chip comprises an embedded ohmic line electrically connected to one of the first active TSV and the second active TSV.

20. The method of claim 15, wherein the carrier chip further comprises a plurality of dummy TSVs between the first active TSV and the second active TSV.

21. The method of claim 15, wherein the carrier chip includes a non-flat surface.

* * * * *